(12) United States Patent
Vautier et al.

(10) Patent No.: US 8,398,885 B2
(45) Date of Patent: Mar. 19, 2013

(54) PORE-FORMING PRECURSORS AND POROUS DIELECTRIC LAYERS OBTAINED THEREFROM

(75) Inventors: Manon Vautier, Paris (FR); Etienne Sandre, Paris (FR)

(73) Assignee: L'Air Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 860 days.

(21) Appl. No.: 12/375,207

(22) PCT Filed: Jul. 30, 2007

(86) PCT No.: PCT/IB2007/002184
§ 371 (c)(1),
(2), (4) Date: Sep. 10, 2009

(87) PCT Pub. No.: WO2008/015533
PCT Pub. Date: Feb. 7, 2008

(65) Prior Publication Data
US 2009/0321679 A1    Dec. 31, 2009

(30) Foreign Application Priority Data
Aug. 1, 2006  (FR) ........................ 06 53228

(51) Int. Cl.
*C09K 3/00* (2006.01)
*B32B 3/26* (2006.01)

(52) U.S. Cl. .............. 252/182.12; 428/304.4; 428/312.6
(58) Field of Classification Search ............. 252/182.12; 427/312.6; 428/312.6
See application file for complete search history.

(56) References Cited

U.S. PATENT DOCUMENTS
6,312,793 B1   11/2001   Grill et al.

FOREIGN PATENT DOCUMENTS
| EP | 1 666 632 | 6/2006 |
| FR | 2 267 296 | 11/1975 |
| WO | WO 2005 112095 | 11/2005 |

OTHER PUBLICATIONS
International Search Report for PCT/IB2007/002184.
Villa De P., et al. "Nopol synthesis over Sn-MCM-41 and Sn-kenyaite catalysts". Catalyst Today, Elsevier, vol. 107-108, Oct. 30, 2005, pp. 942-948.
Written Opinion for corresponding PCT/IB2007/002184, Apr. 7, 2008.

*Primary Examiner* — Peter F Godenschwager
(74) *Attorney, Agent, or Firm* — Allen E. White

(57) ABSTRACT

The invention relates to porous dielectric layers obtained from pore-forming precursors and from matrix precursors. According to the invention, the pore-forming precursors used are chosen form molecules of myrtenol, ethyl chrysanthemumate, jasmine, trimethylbenzene, their positional isomers and their substituted or hydrogenated derivatives. The dielectric constant of the layer obtained is less than or equal to 2.5, starting from matrix precursors having a dielectric constant of less than or equal to 4.

1 Claim, 1 Drawing Sheet

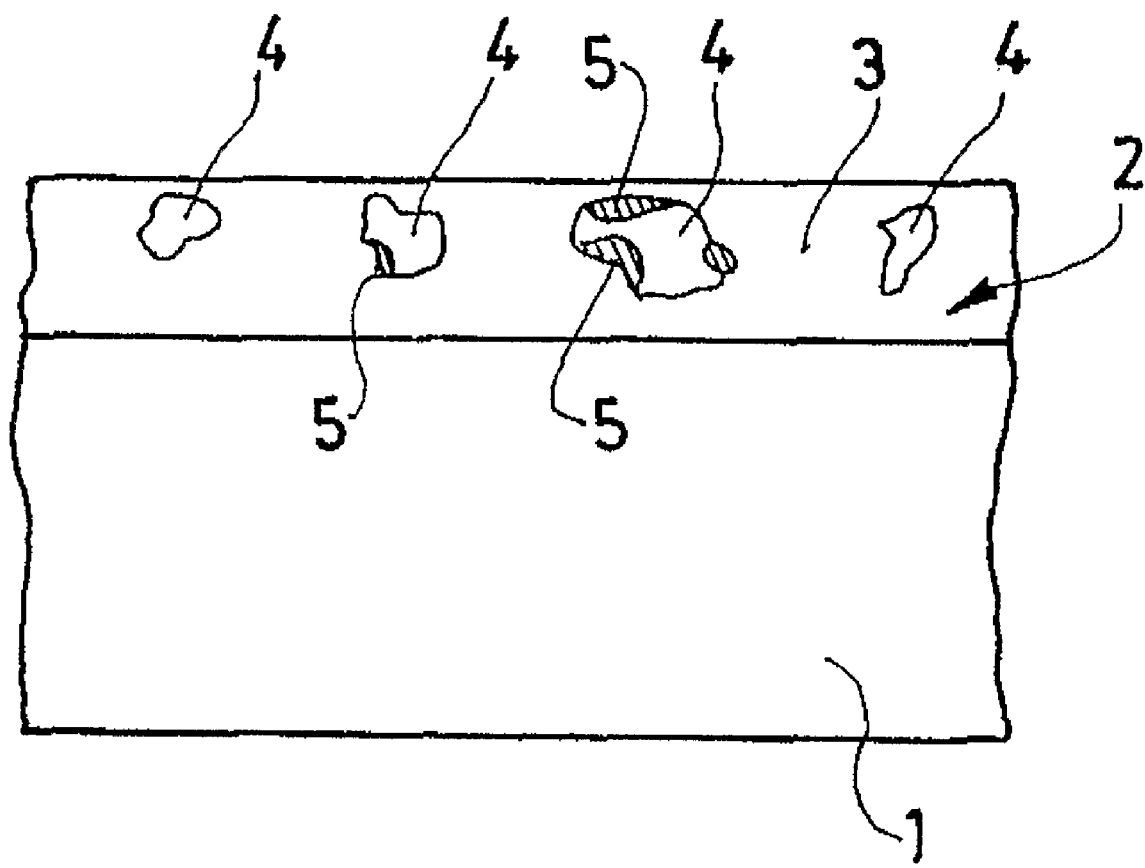

PORE-FORMING PRECURSORS AND POROUS DIELECTRIC LAYERS OBTAINED THEREFROM

This application is a 371 of international PCT Application PCT/IB2007/002184, filed Jul. 30, 2007.

The present invention relates to pore-forming precursors capable of generating volumes free of matter in a dielectric and also to the porous dielectric layers thus formed.

The insulating dielectric layers (known as "interlayer dielectrics") used to separate the metal interconnects between the various electrical circuits of an integrated circuit have to have increasingly low dielectric constants.

For this, it is possible to create porosity in the dielectric itself (that is to say create microcavities free of solid matter) and thus to take advantage of the dielectric constant of air, which is equal to 1.

These are then referred to as ULK (or ultra-low dielectric constant or ultra-low k) porous materials.

To produce such porous layers, conventional low dielectric constant precursors, also known as "matrix" precursors are combined, during the deposition, with organic precursors that are known as pore-forming organic molecules and which have the property of enabling the creation of pores in the "matrix" precursor.

The hybrid film that is obtained, for example by "PECVD" type deposition on a semiconductor substrate, then undergoes a particular treatment (heating, exposure to ultraviolet radiation, electron bombardment) which results in the release of a certain number of chemical molecules from the film (the organic molecules and/or their thermal decomposition products), which creates cavities free of solid matter in the "matrix" dielectric film (for example, an SiOCH film). For further details on the formation of these films reference may be made, for example, to Patent Application WO 2005/112095, or to Patent Application US-A-2002/037442 or to Patent U.S. Pat. No. 6,312,793.

The objective of such films is to create porosity in the "matrix" dielectric, without the structure of the film collapsing, that is to say to obtain a film that still has sufficient mechanical properties;

(the so-called "matrix" dielectric is described in detail in the patents or patent applications referenced above: it is generally formed from a material deposited using precursor molecules containing silicon, carbon, oxygen and hydrogen atoms, more particularly siloxanes such as TMCTS (1,3,5,7-tetramethylcyclotetrasiloxane) or OMCTS (octamethylcyclotetrasiloxane) or certain silane derivatives such as diethoxymethylsilane).

This step, during which this porosity is created in the "matrix", conditions the final success of the production of these films and the mechanical quality of the layers mainly depends on the choice of the matrix molecule and pore-forming molecule combination.

The hybrid material should preferably be both capable of releasing matter under the effect of a treatment, while keeping a stable framework during this release step, but also during the subsequent steps of manufacturing the semiconductor, especially during the steps of polishing the dielectric layers.

The invention proposes to solve the problem posed by the selection of suitable pore-forming organic precursor molecules which, in combination with the "matrix" molecules, will make it possible to generate, on a substrate, a matrix precursor and organic precursor film that has a very low dielectric constant, while enabling the film to have good mechanical strength.

The organic precursors according to the invention make it possible to solve the problem thus posed.

They are characterized in that they comprise at least one molecule chosen from the following molecules:

2,2-dimethyl-3-(2-methylpropenyl)cyclopropanecarboxylic acid ethyl ester, (better known under the name ethyl chrysanthemumate), of formula:

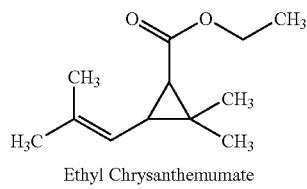

Ethyl Chrysanthemumate 3-methyl-2-(2-pentenyl)-2-cyclopenten-1-one, or jasmone, of formula:

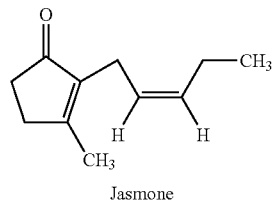

Jasmone 6,6-dimethyl-2-(hydroxymethyl)bicyclo[3.1.1]hept-2-ene, or myrtenol, of formula:

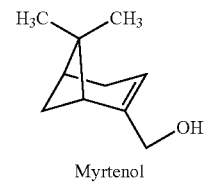

Myrtenol 1,3,5-trimethylbenzene, or mesytilene, of formula:

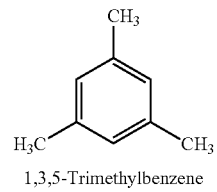

1,3,5-Trimethylbenzene and also their positional isomers and/or their derivatives in which at least one of the terminal methyls and/or hydrogens is replaced by an R group, each R possibly being independently chosen from H or linear or branched $C_1$-$C_5$ alkyls.

According to another aspect of the invention, the porous layer of dielectric having a low dielectric constant k, obtained from at least one matrix precursor and at least one organic precursor, is characterized in that it is composed of a plurality of first volumes comprising solid matter made of matrix precursor and/or matter derived, especially following a heat treatment, from a plurality of second volumes that do not comprise solid matter and of a plurality of third volumes, generally positioned between at least one first volume and at least one second volume and representing less than 1% of the total volume of the porous layer, these third volumes being formed from at least one fraction of organic precursor and/or of derived matter, which may or may not be linked to the matrix precursor, said organic precursor comprising at least one molecule chosen from the following molecules:

2,2-dimethyl-3-(2-methylpropenyl)cyclopropanecarboxylic acid ethyl ester, (better known under the name ethyl chrysanthemumate);

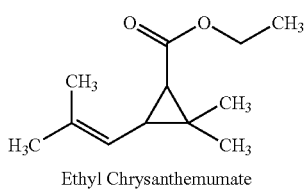

Ethyl Chrysanthemumate 3-methyl-2-(2-pentenyl)-2-cyclopenten-1-one, or jasmone;

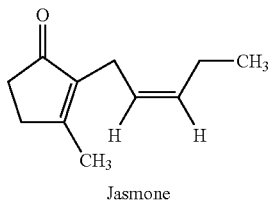

Jasmone 6,6-dimethyl-2-(hydroxymethyl)bicyclo[3.1.1]hept-2-ene, or myrtenol;

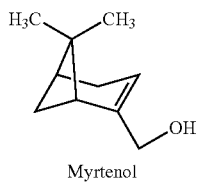

Myrtenol 1,3,5-trimethylbenzene, or mesytilene;

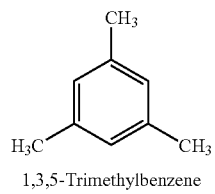

1,3,5-Trimethylbenzene and also their positional isomers and/or their derivatives in which at least one of the terminal methyls and/or hydrogens is replaced by an R group, each R possibly being independently chosen from H or linear or branched $C_1$-$C_5$ alkyls, the dielectric constant of said porous layer being less than or equal to 2.5;

(the term "derived products" is also understood to mean the products derived from these organic precursors and which, following the treatment undergone by the layer (heat treatment, ion bombardment, etc.) are converted alone, or in contact with the matrix molecules, to generate non-gaseous products that are not capable of being removed by diffusion through the layer as the gaseous products derived from the decomposition of the organic precursors generally do).

This layer may be obtained by deposition on a substrate of the 300 mm wafer type in a "PECVD" type reactor by injection of the two precursors using a carrier gas such as He, for example, then heat treatment at a temperature of around 400° C.

The advantages of the pore-forming precursors according to the invention are the following:

The molecules mentioned above are commercially available and relatively inexpensive, have a moderate toxicity, good volatility, several reactive chemical functional groups (for example, unsaturation, ring, carbonyl functional group), sufficient chemical stability so that the packaging, transport and/or storage and also the use do not affect the molecule, and do not require the addition of a stabilizer.

The single figure schematically shows the porous layer obtained according to the invention:

Deposited by the so-called PECVD process, on a substrate 1, was a layer 2 initially consisting of a mixture of a "matrix" precursor 3 and an organic precursor, deposited from their gaseous phases (as, for example, described in the aforementioned patent and patent applications).

The assembly was then subjected, in a manner known per se, to a heat treatment step, at a temperature of the order of around 350° C. to 450° C., for a duration generally of a few tens of minutes, which may or may not be followed by an ion bombardment step, then optionally by a treatment in a moist atmosphere and then drying, as described, for example, in US-A-2005/0227502.

During the heat treatment, the organic precursor is decomposed under the effect of the heat, giving rise to cavities 4 that are free of matter, with however some volumes 5 in which it is possible to identify residual organic matter that has not been completely decomposed, these volumes 5 being located between the volume 3 of matrix precursor and the volumes 4 free of matter. These volumes 5 will preferably always represent less than 1 vol % of the layer after heat (or other) treatment, more preferably less than a few hundred ppm. The matrix precursor volume 3 (also called the first volume in the present application) is generally formed from a single volume having continuity (giving the layer the desired mechanical strength) in which a plurality of second and third volumes 4 and 5 are located. these porous layers having a low dielectric constant that is usually less than 2.5, can be used in manufacturing integrated circuits, flat screens, memory (especially so-called "random access memory") and any similar applications in which a dielectric layer with low dielectric constant is used to insulate two electrical components (dielectric interconnect layers).

They will be more particularly used in the interconnect circuits of the various components of an integrated circuit, called BEOL ("back end of the line") components.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A porous layer of dielectric having a low dielectric constant k obtained from at least one matrix precursor and at least one organic precursor, characterized in that the porous layer of dielectric is composed of
   a) a plurality of first volumes comprising solid matter made from a matrix precursor,
   b) a plurality of second volumes that do not comprise solid matter made and
   c) a plurality of third volumes, positioned between at least one first volume and at least one second volume and representing less than 1% of the total volume of the porous layer,
   d) wherein the plurality of third volumes are formed from an organic precursor comprising:
      A) 6,6-dimethyl-2-(hydroxymethyl)bicyclo[3.1.1]hept-2-ene,
      B) myrtenol;

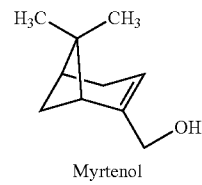

Myrtenol

C) a positional isomer of Myrtenol; or
   D) derivatives of Myrtenol in which at least one of the terminal methyls and/or hydrogen is replaced by an R group, each R being independently chosen from H or linear or branched $C_1$-$C_5$ alkyls,
   e) wherein the dielectric constant of said porous of said porous layer is less than or equal to 2.5.

* * * * *